United States Patent
Ju et al.

(10) Patent No.: US 10,310,182 B2
(45) Date of Patent: Jun. 4, 2019

(54) PATTERNED PLASMONIC UNDERLAYER

(71) Applicant: SEAGATE TECHNOLOGY LLC, Cupertino, CA (US)

(72) Inventors: Ganping Ju, Pleasanton, CA (US); Chubing Peng, Eden Prairie, MN (US); Xiaobin Zhu, San Ramon, CA (US); Yingguo Peng, San Ramon, CA (US); Yukiko Kubota, Campbell, CA (US); Timothy J Klemmer, Fremont, CA (US); Jan-Ulrich Thiele, Sunnyvale, CA (US); Michael A. Seigler, Eden Praire, MN (US); Werner Scholz, Edina, MN (US); Kim Y. Lee, Fremont, CA (US); David S. Kuo, Palo Alto, CA (US); Koichi Wago, Sunnyvale, CA (US)

(73) Assignee: Seagate Technology LLC, Cupertino, CA (US)

( * ) Notice: Subject to any disclaimer, the term of this patent is extended or adjusted under 35 U.S.C. 154(b) by 1297 days.

(21) Appl. No.: 14/055,773

(22) Filed: Oct. 16, 2013

(65) Prior Publication Data

US 2015/0016774 A1   Jan. 15, 2015

Related U.S. Application Data

(60) Provisional application No. 61/844,401, filed on Jul. 9, 2013.

(51) Int. Cl.
G02B 6/122 (2006.01)

(52) U.S. Cl.
CPC .... G02B 6/1226 (2013.01); *H01L 2924/0002* (2013.01); *Y10T 29/49* (2015.01)

(58) Field of Classification Search
CPC .... G11B 5/3133; G11B 5/314; G02B 6/3814; G02B 6/0085; G02B 6/02204; G02B 6/3576

See application file for complete search history.

(56) References Cited

U.S. PATENT DOCUMENTS

| | | | |
|---|---|---|---|
| 8,399,051 B1* | 3/2013 | Hellwig | G11B 5/855 427/131 |
| 8,503,270 B1 | 8/2013 | Kawamori et al. | |
| 2010/0214684 A1* | 8/2010 | Gao | B82Y 10/00 360/59 |
| 2013/0201805 A1* | 8/2013 | Seigler | G11B 5/64 369/13.24 |

* cited by examiner

*Primary Examiner* — Sung H Pak
*Assistant Examiner* — Hoang Q Tran

(57) ABSTRACT

The embodiments disclose a stack feature of a stack configured to confine optical fields within and to a patterned plasmonic underlayer in the stack configured to guide light from a light source to regulate optical coupling.

20 Claims, 7 Drawing Sheets

PATTERNED PLASMONIC UNDERLAYER

CROSS-REFERENCE TO RELATED APPLICATIONS

This application claims the benefit of U.S. Provisional Patent Application Ser. No. 61/844,401 filed Jul. 9, 2013, entitled "A METHOD FOR FABRICATING BPM PATTERNED HAMR MEDIA WITH PATTERNED PUL", by Ju, et al.

DETAILED DESCRIPTION

In a following description, reference is made to the accompanying drawings, which form a part hereof, and in which is shown by way of illustration a specific example in which the embodiments may be practiced. It is to be understood that other embodiments may be utilized and structural changes may be made without departing from the scope.

General Overview:

It should be noted that the descriptions that follow, for example, in terms of a method for fabricating BPM patterned HAMR media with patterned PUL is described for illustrative purposes and the underlying system can apply to any number and multiple types of magnetic recording patterns. In one embodiment, a method for regulating plasmonic near-field transducer functions can be configured using an atomic layer deposition of PUL materials closer to a recording head. The method for regulating plasmonic near-field transducer functions can be configured to include a gradient second heat sink layer and can be configured to include one or more magnetic layers in one embodiment.

Figure 1:
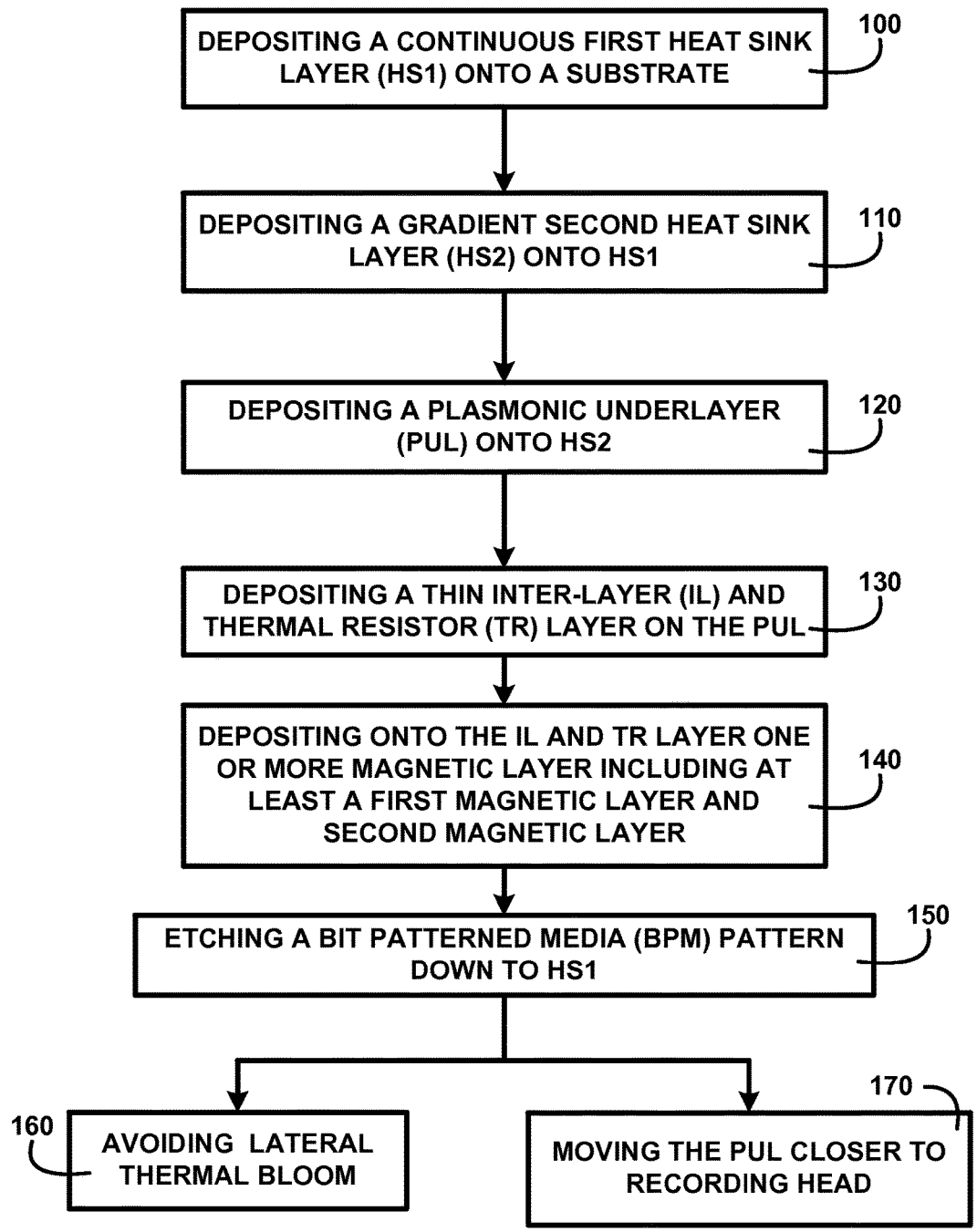
FIG. 1 shows a block diagram of an overview of a method for regulating plasmonic near-field transducer functions of one embodiment.

FIG. 1 shows a block diagram of an overview of a method for regulating plasmonic near-field transducer functions of one embodiment. FIG. 1 shows a method including depositing a continuous first heat sink layer (HS1) onto a substrate 100. This deposition is followed by depositing a gradient second heat sink layer (HS2) onto HS1 110 and depositing a plasmonic underlayer (PUL) onto HS2 120. A deposition process is used for depositing a thin inter-layer (IL) and thermal resistor (TR) layer on the PUL 130. Recording magnetic layers are made by depositing onto the IL and TR layer one or more magnetic layer including at least a first magnetic layer and second magnetic layer 140. An etch process is used for etching a bit patterned media (BPM) pattern down to HS1 150 of one embodiment.

Etching a bit patterned media (BPM) pattern down to HS1 150 includes etching the continuous deposition of the PUL. The etch of the PUL creates patterned features of the PUL and are used for avoiding lateral thermal bloom 160. Typically in a stack a PUL is positioned between the substrate and a continuous heat sink layer. Depositing the PUL on top of the gradient second heat sink layer (HS2) is used for moving the PUL closer to recording head 170 to increase efficiency in optical coupling efficiency of one embodiment.

Optical coupling is usually accomplished by placing two or more electromagnetic elements such as optical waveguides close together so that the evanescent field generated by one element does not decay much before it reaches the other element. With waveguides, if the receiving waveguide can support modes of the appropriate frequency, the evanescent field gives rise to propagating-wave modes, thereby connecting (or coupling) the wave from one waveguide to the next. Optical coupling, evanescent-wave coupling, is fundamentally identical to near field interaction in electromagnetic field theory.

DETAILED DESCRIPTION

Figure 2:
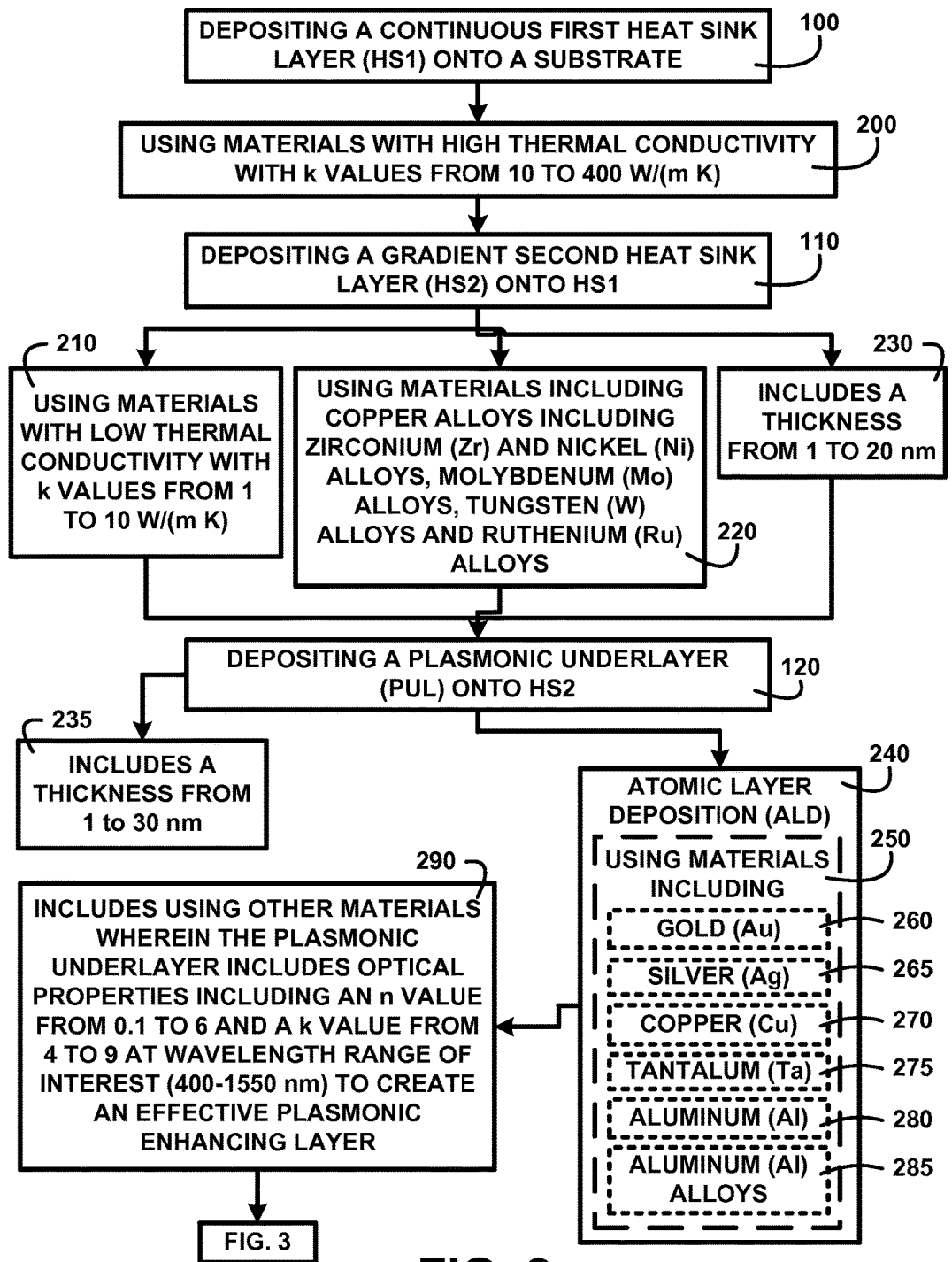
FIG. 2 shows a block diagram of an overview flow chart of a method for regulating plasmonic near-field transducer functions of one embodiment.

FIG. 2 shows a block diagram of an overview flow chart of a method for regulating plasmonic near-field transducer functions of one embodiment. Plasmonic devices including a plasmonic underlayer (PUL) efficiently confine optical fields at a nanoscale to locally heat a recording medium for data storage in a heat assisted magnetic recording (HAMR) stack including bit patterned media (BPM). The recording head of a HAMR recording system contains a light source for example an infrared or near-infrared laser diode, a light delivery system, which guides the light to a plasmonic near-field transducer for example the plasmonic underlayer (PUL), and a magnetic write pole, which generates magnetic field and magnetizes the recording medium for example the one or more magnetic layer. The confining of near-field optical effects transmitted from a recording head is used to target a particular etched BPM pillar (dot) feature to temporarily heat the medium to lower the switching field of high magnetocrystalline anisotropy, small grain media.

The media is typically heated above the Curie temperature, but the actual recording process happens below the Curie temperature because the finite magnetic field can still switch/influence the magnetic media when it has recovered some (small) magnetization and magnetocrystalline anisotropy. There is no electrical current flowing between the recording head and the recording media. The heating of the recording media happens by absorption of the electromagnetic field in the media, not by "direct" heating by the near field transducer. In addition, all materials in the recording media stack (including interlayers and heat sinks) can and will absorb the electromagnetic field and convert it into heat of one embodiment.

After the media is written, it cools rapidly (<1 ns) for long-term storage. Because the size, for example the nanoscaled grains of a patterned magnetic layers in a bit patterned media stack, of the region to be heated in the media is well below the optical diffraction limit, a writer must use a near-field device such as a plasmonic device made of a lowloss metal (gold, silver, copper) for the creation of resonant charge motion at the metal surface of one embodiment.

Thermal conductivity is the measure of the speed of heat flow passed from particle to particle. The rate of heat flow through a specific material will be influenced by the difference of temperature and by its thermal conductivity. Thermal conductivity is a measure of the capacity of a material to conduct heat through its mass. It can be defined as the amount of heat/energy (expressed in kcal, Btu or J) that can be conducted in unit time through unit area of unit thickness of material, when there is a unit temperature difference. Thermal conductivity is also known as the k-value and can be expressed in the SI system in watt (W) $m^{-1}$ $K^{-1}$ of one embodiment.

FIG. 2 shows depositing a continuous first heat sink layer (HS1) onto a substrate 100 using materials with high thermal conductivity with k values from 10 to 400 W/(m K) 200 where W/(m K) is defined as watts per meter kelvin. This deposition is followed by depositing a gradient second heat sink layer (HS2) onto HS1 110 using materials with low thermal conductivity with k values from 0.1 to 30 W/(m K) 210. The deposition of the gradient second heat sink layer includes using materials including copper alloys including zirconium (Zr) and nickel (Ni) alloys, molybdenum (Mo) alloys, tungsten (W) alloys and ruthenium (Ru) alloys 220 and the deposition includes a thickness from 1 to 20 nm 230 of one embodiment.

A subsequent process is depositing a plasmonic underlayer (PUL) onto HS2 120 using an atomic layer deposition (ALD) 240. The deposition of the plasmonic underlayer (PUL) includes a thickness from 1 to 30 nm 235. The PUL atomic layer deposition (ALD) 240 is made using materials including 250 including gold (Au) 260, silver (Ag) 265, copper (Cu) 270, Tantalum (Ta) 275, aluminum (Al) 280 and aluminum (Al) alloys 285. The plasmonic underlayer (PUL) deposition includes using other materials wherein the plasmonic underlayer includes optical properties including an n value from 0.1 to 6 and a k value from 4 to 9 at wavelength range of interest (400-1550 nm) to create an effective plasmonic enhancing layer 290 of one embodiment.

The wavelength range of interest is a typical telecommunications wavelength for which there are laser diodes available and at such longer wavelength, many metals exhibit amplified optical properties for use as plasmonic near field transducers. In the context of optical properties including an n value from 0.1 to 6 and a k value from 4 to 9 at wavelength range of interest (400-1550 nm), an n value is defined where n is the index of refraction (n) and a k value is defined where k is the extinction coefficient. The description of the method processes is described continuing in FIG. 3 of one embodiment.

Figure 3:
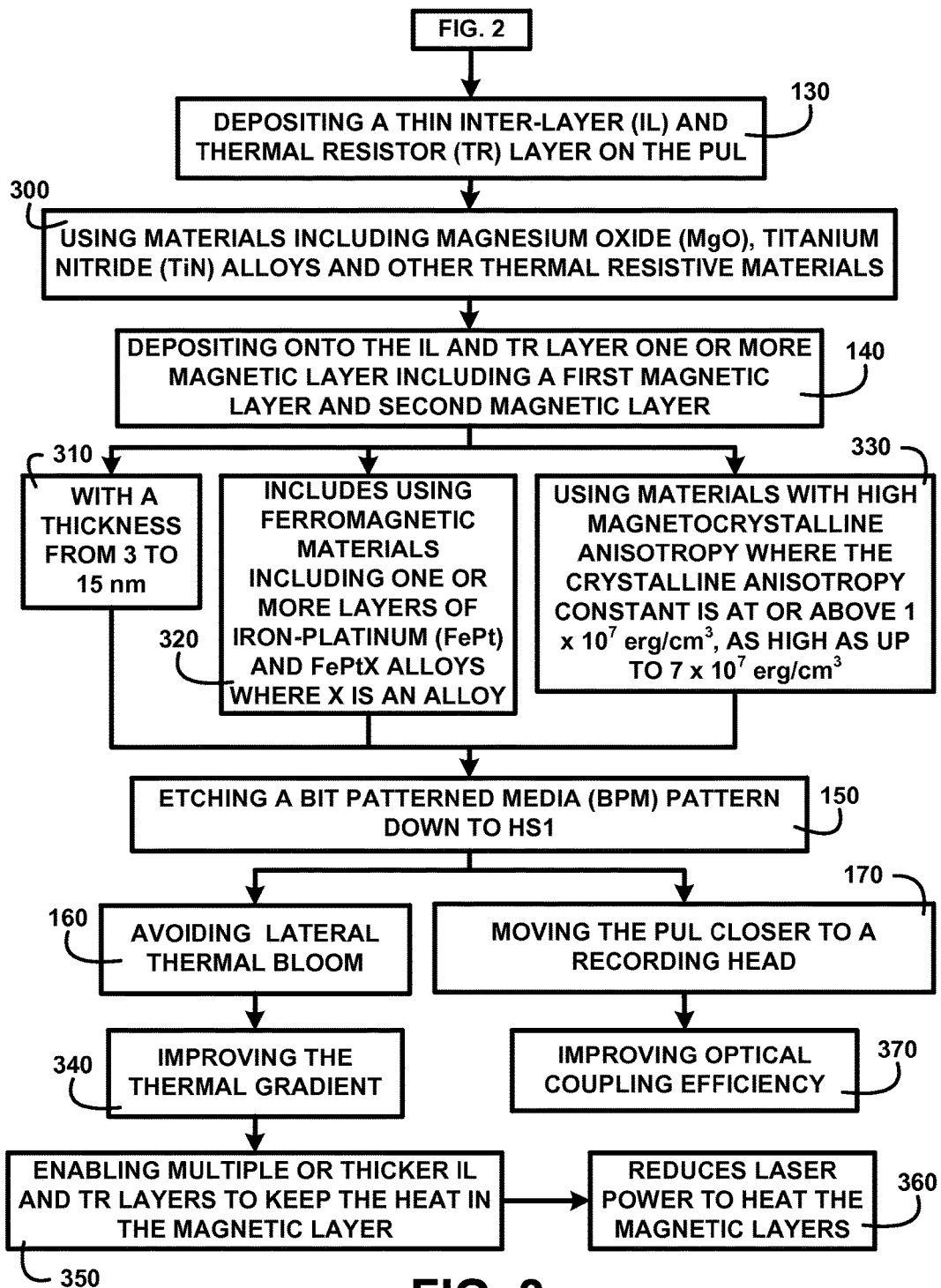
FIG. 3 shows a block diagram of an overview flow chart of etching a bit patterned media (BPM) pattern down to HS1 of one embodiment.

FIG. 3 shows a block diagram of an overview flow chart of etching a bit patterned media (BPM) pattern down to HS1 of one embodiment. FIG. 3 shows processes continuing from FIG. 2 including depositing a thin inter-layer (IL) and thermal resistor (TR) layer on the PUL 130. The thin inter-layer (IL) and thermal resistor (TR) layer deposition includes using materials including magnesium oxide (MgO), titanium nitride (TiN) alloys and other thermal resistive materials 300. A deposition process is used for depositing onto the IL and TR layer one or more magnetic layer including at least a first magnetic layer and second magnetic layer 140 and includes using ferromagnetic materials including one or more layers of iron-platinum (FePt) and FePtX alloys where X is an alloy 320 and includes using materials with high magnetocrystalline anisotropy where the crystalline anisotropy constant is at or above $1\times10^7$ erg/cm$^3$, as high as up to $7\times10^7$ erg/cm$^3$ 330. The depositing of the one or more magnetic layer includes a deposition with a thickness from 3 to 15 nm 310 of one embodiment.

Etching a bit patterned media (BPM) pattern down to HS1 150 includes etching of the PUL for avoiding lateral thermal bloom 160 and improving the thermal gradient 340. The etching of the PUL reduces its mass within a BPM feature and enabling multiple or thicker IL and TR layers to keep the heat in the magnetic layer 350. The patterned PUL confines heat applied by a recording head to the BPM feature without heat losses due to lateral thermal bloom. The patterned PUL thereby reduces power used to heat the magnetic layers 360. Fabricating the patterned PUL and moving the PUL closer to a recording head 170 results in improving optical coupling efficiency 370 of one embodiment.

Figure 4:
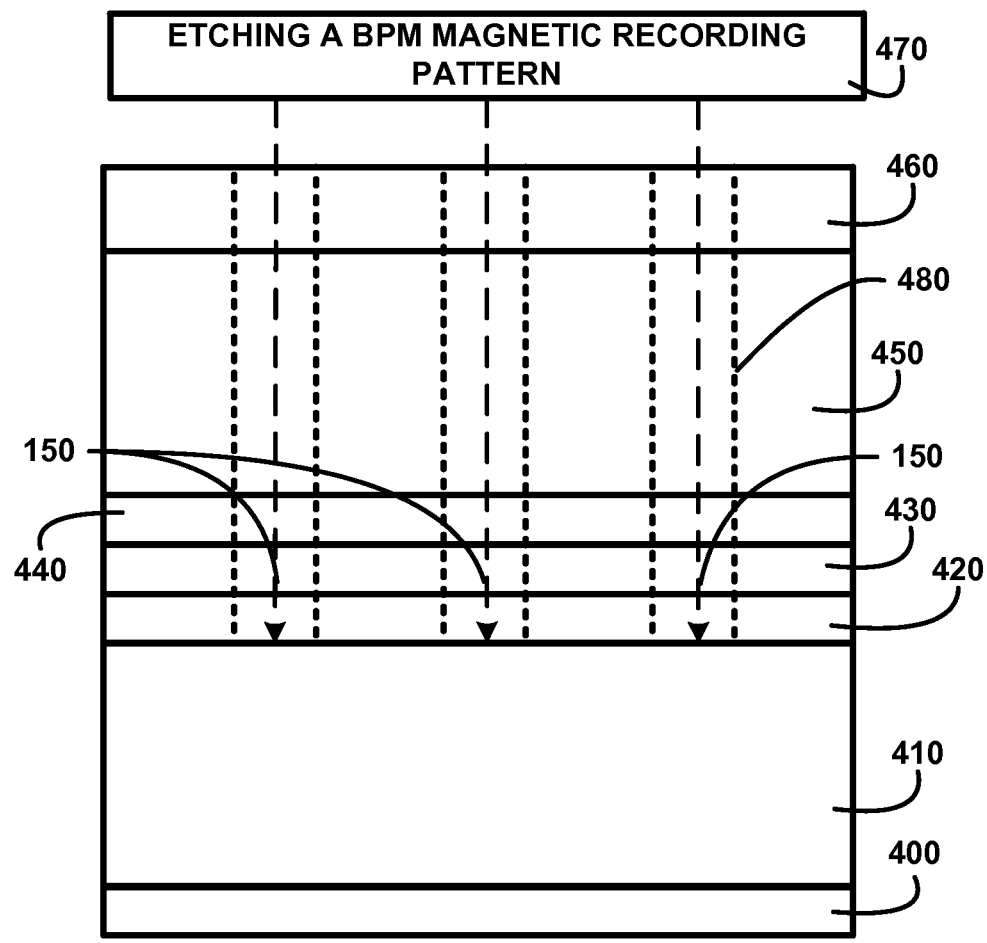
FIG. 4 shows for illustrative purposes only an example of etching a BPM magnetic recording pattern of one embodiment.

FIG. 4 shows for illustrative purposes only an example of a patterned PUL of one embodiment. FIG. 4 shows a substrate 400 and deposited on a continuous first heat sink layer (HS1) 410, continuous gradient second heat sink layer 420 and continuous plasmonic underlayer 430. A thin inter-layer and thermal resistor layer 440 is deposited on the continuous plasmonic underlayer 430. The first magnetic layer 450 and second magnetic layer 460 are deposited on the thin inter-layer and thermal resistor layer 440. An etch process is used for etching a BPM magnetic recording pattern 470. Etching a bit patterned media (BPM) pattern down to HS1 150 including etching the continuous plasmonic underlayer 430 creates a plurality of patterned PUL BPM pillar (dot) pattern features of one embodiment.

Figure 5:
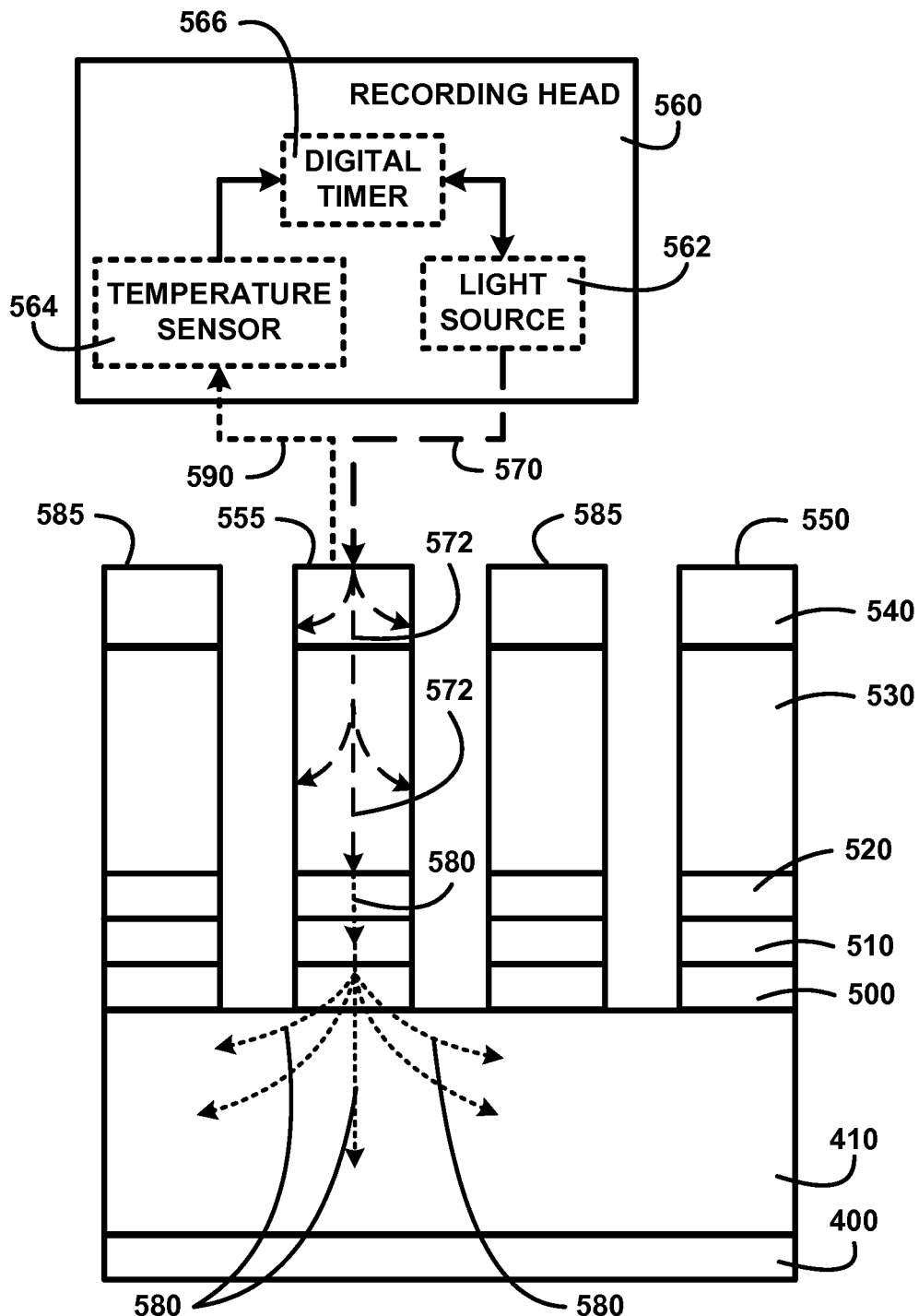
FIG. 5 shows for illustrative purposes only an example of avoiding lateral thermal bloom of one embodiment.

FIG. 5 shows for illustrative purposes only an example of avoiding lateral thermal bloom of one embodiment. FIG. 5 shows the substrate 400, continuous first heat sink layer (HS1) 410 and patterned gradient second heat sink layer 500. The patterned plasmonic underlayer (PUL) 510, patterned thin inter-layer (IL) and thermal resistor (TR) layer 520, patterned first magnetic layer 530 and patterned second magnetic layer 540 are included in a patterned device structure 550. A recording head 560 is used to transmit a electromagnetic field 570 to the patterned device structure 550.

The patterned first magnetic layer 530 and patterned second magnetic layer 540 heat up by absorption of the electromagnetic field 570 and generated heat spreads by conducted heat 572 distributing heat throughout the magnetic materials. The patterned plasmonic underlayer (PUL) 510 efficiently confines the electromagnetic field 570 from the recording head 560 to rapidly raise the temperature of the magnetic material above Tc. More rapid heating enables the reduction in the power used by the recording head 560 of one embodiment.

The writer induces the polarity of the magnetization in the magnetic recording media materials by generating a magnetic field with the desired polarity (direction) and thereby encoding the data into the targeted patterned device structure 555 as the magnetic materials cool rapidly below Tc. The heat dissipation 580 from the magnetic materials passes through the patterned thin inter-layer (IL) and thermal resistor (TR) layer 520 and patterned plasmonic underlayer (PUL) 510 quickly to the patterned gradient second heat sink layer (HS2) 500 and continuous first heat sink layer (HS1) 410. The rapid cooling is accomplished due to the greater thermal conductivity of both heat sink layers and the greater mass of each capable of absorbing the heat dissipation 580. The patterned plasmonic underlayer (PUL) 510 lacks material to laterally transfer heat to adjacent magnetic patterned features including non-targeted adjacent patterned device structure 585. This avoids lateral thermal bloom and stabilizes the thermal gradient. The stabilization of the thermal gradient enables using multiple or thicker inter-layer and thermal resistor layer to keep the heat in the magnetic layer of one embodiment.

An apparatus including a recording head 560, temperature sensor 564 and digital timer 566 can be used to apply heat to the magnetic materials in a targeted patterned device structure 555. The heat generated in the recording medium by absorption of the electromagnetic field 570 generated by the recording head 560 is distributed by conducted heat 572 throughout the magnetic material of the targeted patterned device structure 555. This enables the magnetic materials of the targeted patterned device structure 555 to reach a temperature above Tc of one embodiment.

The temperature sensor 564 can be used to determine the rising temperature of the magnetic materials using the confining efficiency of the patterned plasmonic underlayer (PUL) 510. The duration of time from the start of the recording head 560 to the point in time when the targeted patterned device structure 555 reaches a temperature at or above Tc can be determined and recorded using the digital timer 566. When the temperature at or above Tc is reached the temperature sensor 564 can turn-off the power to the recording head 560 of one embodiment.

The temperature sensor 564 and digital timer 566 can be used to determine the heat flow rate (DT/Dt) of the heat gain and heat dissipation cooling period of the magnetic materials in the targeted patterned device structure 555. A periodic determination of the heat flow rates can for example be stored and used as an adjustable predetermined cycle time. The adjustable predetermined cycle time can for example be used to make adjustments in the power levels and duration in the recording head 560 heating source including a light source 562 depending on current ambient temperature and read/write speeds of a particular magnetic drive device. The temperature sensor 564 readings can be used to switch-off the power to the recording head 560 heating source including a light source 562 and turn-on and off the power to a writing module current during a recording function of one embodiment.

Figure 6:
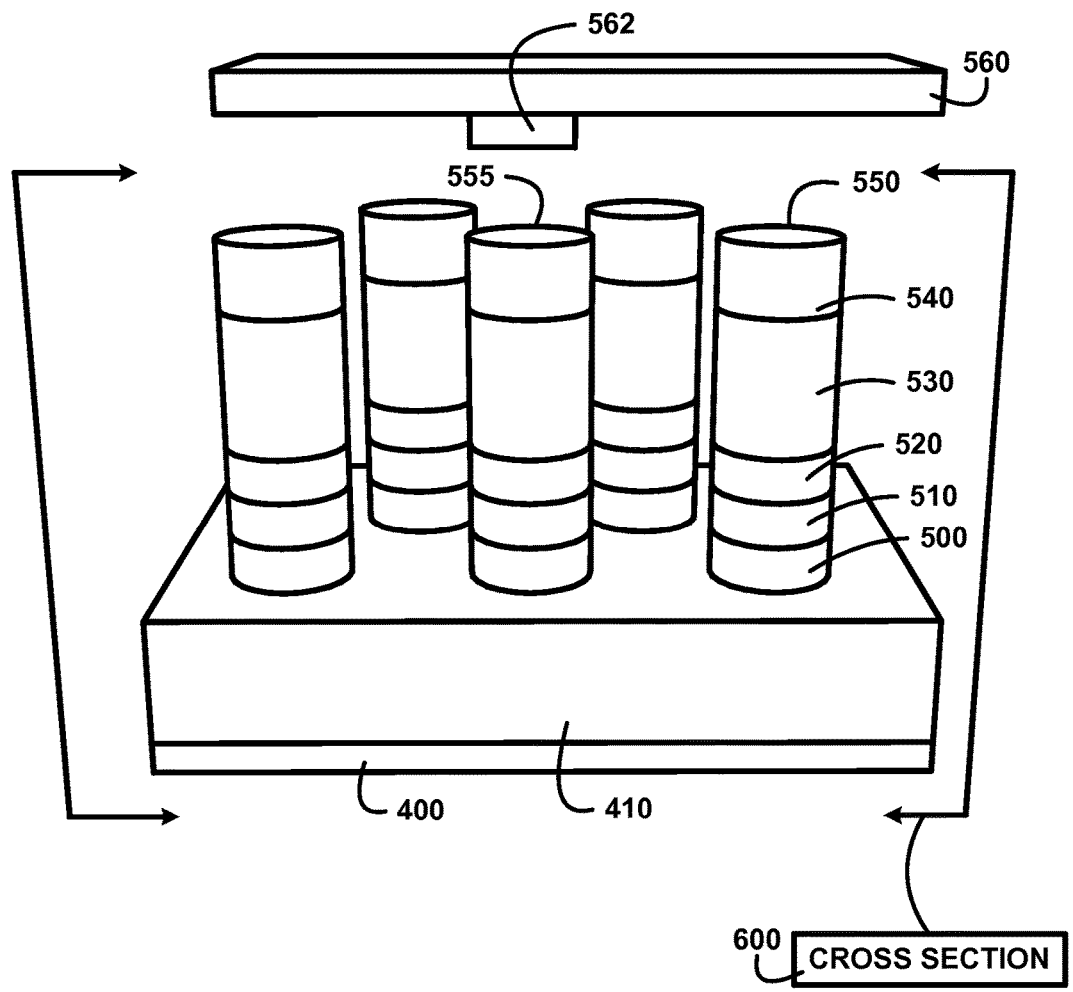
FIG. 6 shows for illustrative purposes only an example a patterned plasmonic underlayer closer to a recording head of one embodiment.

FIG. 6 shows for illustrative purposes only an example a patterned plasmonic underlayer closer to a recording head of one embodiment. FIG. 6 shows one embodiment including for example a patterned device structure 550 including at least one bit-patterned media (BPM) feature on a substrate. FIG. 6 shows a substrate 400, a continuous first heat sink layer (HS1) 410, a patterned gradient second heat sink layer (HS2) 500, a patterned plasmonic underlayer (PUL) 510, a patterned thin inter-layer (IL) and thermal resistor (TR) layer 520, a patterned first magnetic layer 530, a patterned second magnetic layer 540, a patterned device structure 550, and a targeted patterned device structure 555 including a bit-patterned media (BPM) feature.

FIG. 6 shows the recording head 560 positioning the light source 562 above the targeted patterned device structure 555. The targeted patterned device structure 555 includes the patterned plasmonic underlayer (PUL) 510 in close proximity to the light source 562. Cross section 600 lines indicate where a cross section is cut that will be illustrated in FIG. 7.

Figure 7:
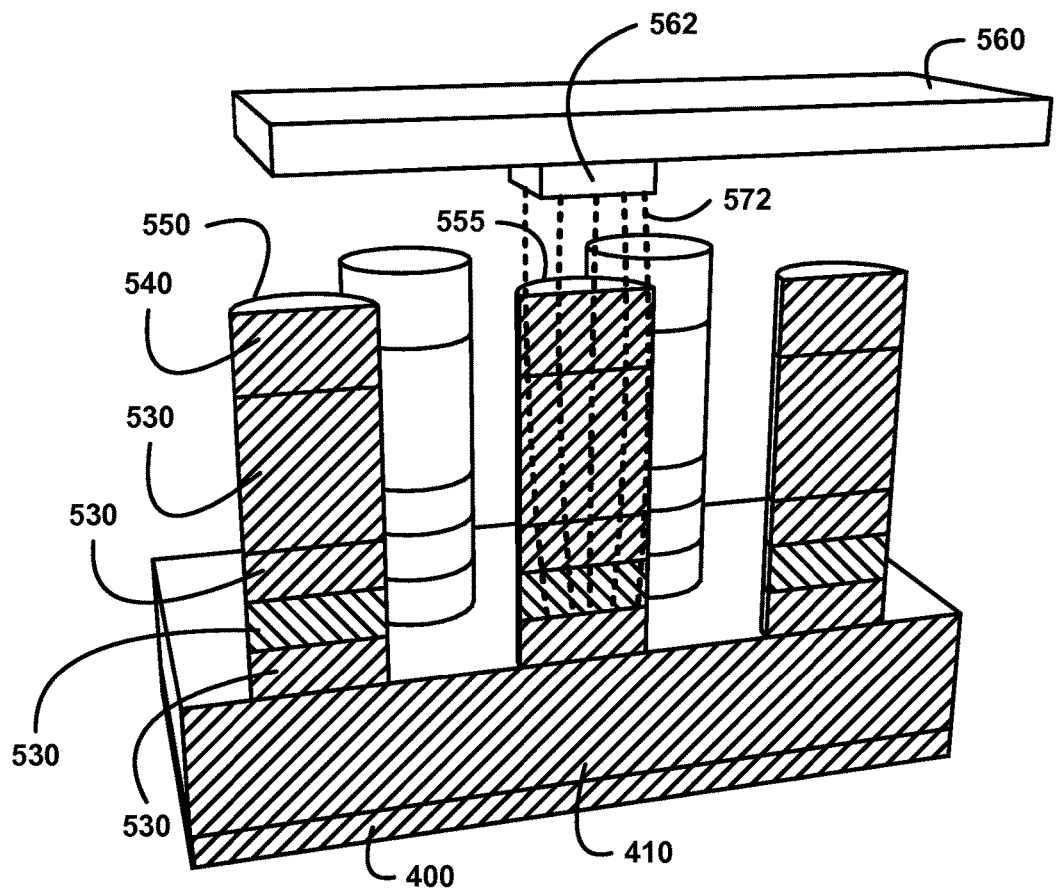
FIG. 7 shows for illustrative purposes only an example of a patterned plasmonic underlayer regulating optical fields of one embodiment.

FIG. 7 shows for illustrative purposes only an example of a patterned plasmonic underlayer regulating optical fields of one embodiment. FIG. 7 shows the cross section 600 view of the patterned device structure 550 with cross hatched lines. Additionally shown are the substrate 400, continuous first heat sink layer (HS1) 410, patterned gradient second heat sink layer (HS2) 500, patterned plasmonic underlayer (PUL) 510 with cross hatched lines in another orientation for ease of identifying visually in this example.

FIG. 7 also shows other elements of the patterned device structure 550 including the patterned thin inter-layer (IL) and thermal resistor (TR) layer 520, patterned first magnetic layer 530, and patterned second magnetic layer 540. The targeted patterned device structure 555 including a bit-patterned media (bpm) feature is shown with the recording head 560 light source 562 projecting a electromagnetic field 570 into the patterned second magnetic layer 540. The generated heat spreads by conducted heat 572 distributing heat throughout the magnetic materials including those in the patterned first magnetic layer 530 of one embodiment.

The heat up of the magnetic materials is accelerated by the patterned plasmonic underlayer (PUL) 510 in close proximity of the recording head 560. The patterned plasmonic underlayer (PUL) 510 confines or focuses the optical fields to the area of the patterned plasmonic underlayer (PUL) 510 and diffusion of the light source is minimized. The concentrates the energy of the optical fields within the magnetic materials which raises the temperature faster and thereby reduces the total power used to temporarily heat the materials to lower the switching field of high magnetocrystalline anisotropy, small grain media of the targeted patterned device structure 555. The patterned plasmonic underlayer (PUL) 510 creates a plasmonic near-field transducer which guides the light to the plasmonic near-field transducer of one embodiment.

The foregoing has described the principles, embodiments and modes of operation. However, these should not be construed as being limited to the particular embodiments discussed. The above described embodiments should be regarded as illustrative rather than restrictive, and it should be appreciated that variations may be made in those embodiments by workers skilled in the art without departing from the scope as defined by the following claims.

What is claimed is:

1. An apparatus comprising
   a substrate;
   a continuous layer over the substrate comprising
      a first heat sink layer; and
   a plurality of patterned features over the continuous layer comprising
      a second heat sink layer,
      a plasmonic underlayer over the second heat sink layer, and
      a magnetic layer over the plasmonic underlayer,
      wherein the position of the plasmonic underlayer in the plurality of patterned features confines patterned feature-applied heat without substantial loss of the heat to other patterned features through lateral thermal bloom.

2. The apparatus of claim 1,
   wherein the plasmonic underlayer positioned in the plurality of patterned features instead of in-between the substrate and the first heat sink layer reduces laser power requirements for heating the patterned features.

3. The apparatus of claim 1,
   wherein the plasmonic underlayer comprises an index of refraction n from 0.1 to 6 and an extinction coefficient k from 4 to 9 at wavelength of 400-1550 nm.

4. The apparatus of claim 1,
   wherein the plasmonic underlayer comprises a material selected from Au, Ag, Cu, Ta, Al, and Al alloys.

5. The apparatus of claim 1,
   wherein the plasmonic underlayer is 1 to 30 nm thick.

6. The apparatus of claim 1,
   wherein the first heat sink layer comprises a high thermal conductivity k from 10 to 400 W/(mK).

7. The apparatus of claim 6,
wherein the second heat sink layer comprises a low thermal conductivity k from 10.1 to 30 W/(mK).

8. The apparatus of claim 1,
wherein the second heat sink layer comprises a material selected from a zirconium alloy, a nickel alloy, a molybdenum alloy, a tungsten alloy, and a ruthenium alloy.

9. The apparatus of claim 1,
wherein the second heat sink layer is 1 to 20 nm thick.

10. The apparatus of claim 1,
wherein the magnetic layer comprises one or more layers of FePt alloys at 3 to 15 nm thick.

11. An apparatus comprising
a first, continuous heat sink layer; and
a patterned layer over the first heat sink layer comprising
    a second heat sink layer,
    a plasmonic underlayer over the second heat sink layer,
    a first magnetic layer over the plasmonic underlayer, and
    a second magnetic layer over the first magnetic layer.

12. The apparatus of claim 11,
wherein the plasmonic underlayer comprises a material selected from Au, Ag, Cu, Ta, Al, and Al alloys at 1 to 30 nm thick.

13. The apparatus of claim 11,
wherein the plasmonic underlayer comprises an index of refraction n from 0.1 to 6 and an extinction coefficient k from 4 to 9 at wavelength of 400-1550 nm.

14. The apparatus of claim 13,
wherein the first heat sink layer comprises a high thermal conductivity k from 10 to 400 W/(m·K).

15. The apparatus of claim 14,
wherein the second heat sink layer comprises a low thermal conductivity k from 10.1 to 30 W/(m·K).

16. An apparatus comprising
a plurality of patterned features comprising
    a second heat sink layer,
    a plasmonic underlayer over the second heat sink layer,
    a first magnetic layer over the plasmonic underlayer, and
    a second magnetic layer over the first magnetic layer.

17. The apparatus of claim 16, further comprising
a continuous layer comprising a first heat sink layer,
    wherein the plurality of patterned features is over the continuous layer.

18. The apparatus of claim 16,
wherein the plasmonic underlayer comprises a material selected from Au, Ag, Cu, Ta, Al, and Al alloys at 1 to 30 nm thick.

19. The apparatus of claim 16,
wherein the second heat sink layer is 1 to 20 nm thick.

20. The apparatus of claim 16,
wherein the first and second magnetic layers comprise FePt alloys at 3 to 15 nm thick.

* * * * *